United States Patent [19]

Motai et al.

[11] Patent Number: 4,916,090
[45] Date of Patent: Apr. 10, 1990

[54] AMORPHOUS SILICON THIN FILM TRANSISTOR AND METHOD OF MANUFACTURING THE SAME

[75] Inventors: Noboru Motai; Yoshihisa Ogiwara, both of Tochigi; Yasunari Kanda, Tokyo, all of Japan

[73] Assignees: Nippon Precision Circuits Ltd.; Seikosha Co., Ltd., both of Tokyo, Japan

[21] Appl. No.: 322,842

[22] Filed: Mar. 13, 1989

[30] Foreign Application Priority Data

Mar. 23, 1988 [JP] Japan ................... 63-68697

[51] Int. Cl.⁴ .................. H01L 21/22; H01L 21/223; H01L 21/326
[52] U.S. Cl. ....................................... 437/141; 437/41; 437/147; 437/170; 437/171; 437/173; 437/101; 357/4; 357/23.7; 148/DIG. 30; 148/DIG. 34
[58] Field of Search ................... 437/40, 41, 141, 147, 437/171, 101, 170, 173; 357/4, 23.7; 148/DIG. 30, DIG. 34

[56] References Cited

U.S. PATENT DOCUMENTS

| | | | |
|---|---|---|---|
| 3,290,569 | 12/1966 | Weimer | 357/4 |
| 4,068,020 | 1/1978 | Reuschel | 437/141 |
| 4,459,739 | 7/1984 | Shepherd et al. | 437/25 |
| 4,468,260 | 8/1984 | Hiramoto | 437/141 |
| 4,565,588 | 1/1986 | Seki et al. | 437/141 |
| 4,584,028 | 4/1986 | Pankove et al. | 437/141 |
| 4,698,104 | 10/1987 | Barker et al. | 437/141 |

Primary Examiner—Brian E. Hearn
Assistant Examiner—M. Wilczewski
Attorney, Agent, or Firm—Jordan and Hamburg

[57] ABSTRACT

A method for manufacturing a amorphous silicon thin film transistor comprises exposing an morphous silicon layer situated between a source electrode and a drain electrode to a gas phase atmosphere having a gas containing an impurity forming an acceptor, then activating said impurity with an electric field or light energy and doping the activated impurity into said amorphous silicon layer. The gas may be a hydrogen compound and it may include an oxidizing gas.

11 Claims, 4 Drawing Sheets

FIG. 5 PRIOR ART
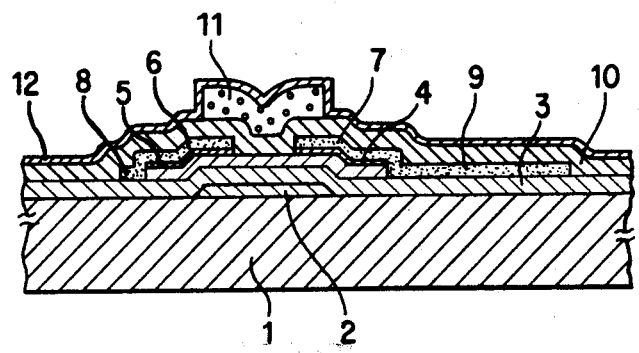
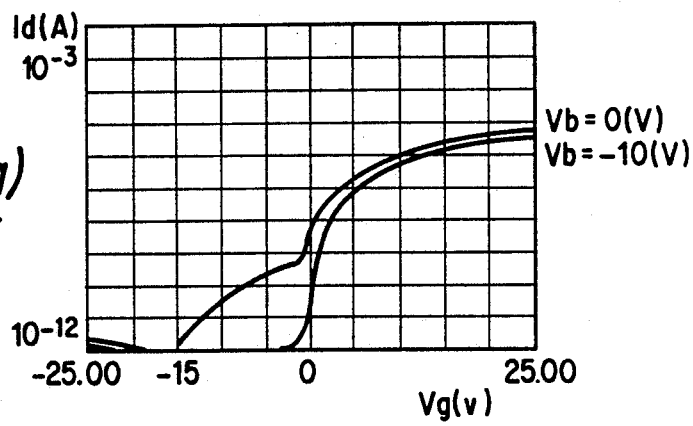
FIG. 6(a) PRIOR ART
FIG. 6(b) PRIOR ART
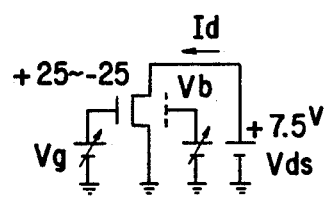

4,916,090

AMORPHOUS SILICON THIN FILM TRANSISTOR AND METHOD OF MANUFACTURING THE SAME

FIELD OF THE INVENTION

The present invention relates to a method of manufacturing an amorphous silicon (hereinafter referred to as a-Si) thin film transistor (hereinafter referred to as TFT).

BACKGROUND OF THE INVENTION

Research and development has been conducted for producing an a-SiTFT for use in active matrix type liquid crystal display devices, etc.

FIG. 5 is a cross sectional view illustrating an a-SiTFT. This Figure shows the insulation substrate 1, gate electrode 2, gate insulation layer 3, amorphous silicon layer 4, n-type silicon layer 5 containing an appropriate amount of phosphor, source electrode 6, drain electrode 7, source wiring 8, pixel electrode 9, protection insulation layer 10, light shielding layer 11 and orientation film 12. A TFT having a structure as shown in the Figure in which the gate electrode 2, the source electrode 6 and the drain electrode 7 are opposed while the gate insulation layer 3 and the amorphous silicon layer 4 are between the gate electrode and the source and drain electrodes, and the gate electrode 2 is formed on the side of the insulation substrate 1 remote from the source electrode 6 and the drain electrode 7, is referred to as an inverted stagger type TFT.

FIGS. 6(a) and (b) show a static characteristic of the inverted stagger type a-SiTFT. In FIG. 6(a), the abscissa represents a gate voltage $V_g$ and the ordinate represents a drain current Id. FIG. 6(b) shows a measuring circuit in which the source-drain voltage Vds=7.5 (volts) is made constant and the voltage Vb applied to the light shielding layer is set to Vb=0 (volts) or $-10$ (volts). As can be seen from FIG. 6(a), the drain current Id rises from the vicinity of Vg=0 (volts) when Vb= $-10$ (volts), whereas the drain current Id rises from the vicinity of Vg= $-15$ (volts) when Vb=0 (volts) and, accordingly, the two characteristics are apparently different.

FIG. 7 shows the reason for such a difference in the characteristics. Electric current flowing through a TFT usually comprises a current flowing along the interface between the gate insulation layer 3 and the amorphous silicon layer 4, that is, a current flowing through the path A as shown in FIG. 7. However, in a TFT, a current path shown by B in FIG. 7 is also present along the interface between the protection insulation layer 10 and the amorphous silicon layer 4 in the TFT.

Accordingly, in the characteristic shown in FIG. 6(a), the current path B is interrupted when Vb= $-10$ (volts), whereas the current path B is not interrupted when Vb=0 (volts) to provide the characteristic as shown in FIG. 6(a). That is, the current that rises from the vicinity of Vg= $-15$ (volts) when Vb=0 volts) is derived from the current path B.

Since no voltage is applied to the light shielding layer in the usual state of use, the static characteristic of the TFT is the same as the characteristic when Vb=0 (volts). Such a characteristic results in the increase of the OFF current of the TFT. This result is disadvantageous in the use of the TFT.

SUMMARY OF THE INVENTION

The present invention has been made in view of the above-described problems and it is an object thereof to reduce the OFF current in a TFT.

BRIEF DESCRIPTION OF THE DRAWINGS

FIG. 5 is a cross sectional view illustrating a conventional amorphous silicon thin film transistor;

FIGS. 6(a) and (b) are a characteristic chart and a diagram showing the static characteristic in a conventional embodiment.

DESCRIPTION OF THE PREFERRED EMBODIMENTS

An embodiment of the present invention will now be explained with reference to the drawings.

Figure 1:
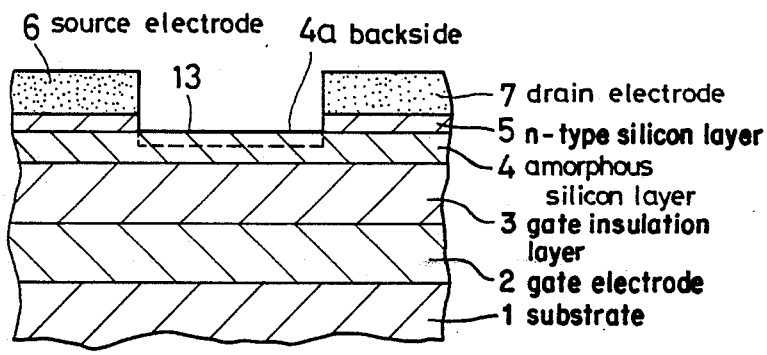
FIG. 1 is a cross sectional view of an amorphous silicon thin film transistor manufactured by the manufacturing method in accordance with one embodiment of the present invention.

FIG. 1 shows an insulation substrate 1 made of glass, etc., gate electrode 2, gate insulation layer 3, amorphous silicon layer 4, n-type silicon layer 5, source electrode 6, drain electrode 7, impurity layer 13 containing an impurity forming an acceptor for the amorphous silicon layer 4, and a gas phase atmosphere 14 having a gas containing an impurity forming the acceptor.

In this embodiment, as shown in this Figure, the amorphous silicon layer 4 is exposed on the side 4a thereof away from the gate electrode to the gas phase atmosphere 14, and the gas contains an impurity forming an acceptor for the amorphous silicon layer. The impurity is activated by means of an electric field or light energy, thereby doping the impurity from the side 4a of the amorphous silicon layer 4 into the amorphous silicon layer. A hydrogen compound is preferred for the gas containing the impurity forming the acceptor, and $B_2H_6$ (diborane), etc. can be used for this purpose. Specifically, $H_2$ is further added and the gas is decomposed by plasma to thereby activate the B (boron) and dope the amorphous silicon layer.

Figure 2:
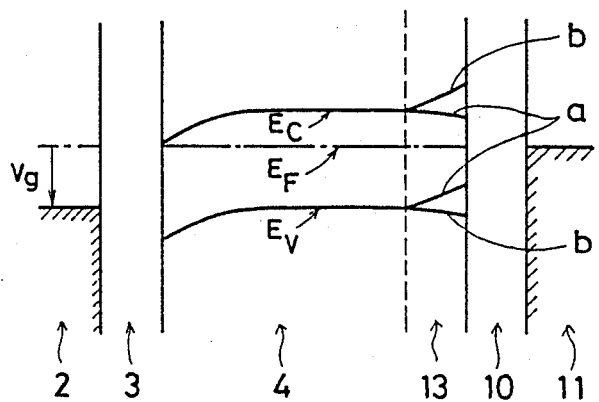
FIG. 2 is an explanatory view showing the energy band before and after doping the impurity.

FIG. 2 shows an energy band before and after impurity doping the TFT. The drawing shows gate electrode 2, gate insulation layer 3, and amorphous silicon layer 4, as well as protection insulation layer 10, light shielding layer 11 and impurity layer 13 of the completed TFT. Before doping with the impurity, the amorphous silicon layer at the interface between the amorphous silicon layer 4 and the protection insulation layer is an n-type, and the conduction band lower end Ec and the valence band upper end Ev extend downward as indicated at a (FIG. 2), Therefore, the conduction band lower end Ec approaches the Fermi level Ef and forms an electric path at the interface for movable electrons. On the other hand, after doping with the impurity, the amorphous silicon layer at the interface is a p-type, in which the conduction band lower end Ec and the valence band upper end Ev extend upward as indicated at b (FIG. 2). Accordingly, there is no longer a current path for movable electrons.

Figure 3A:
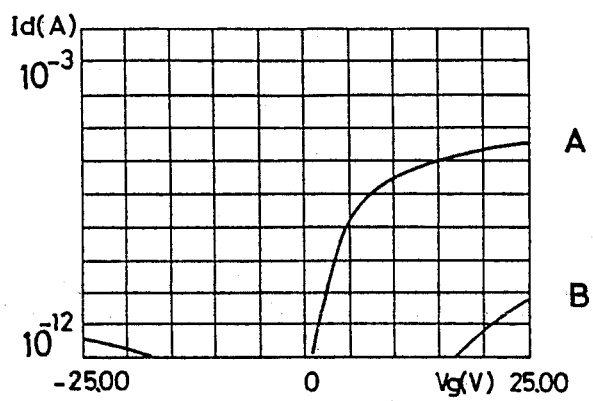
FIGS. 3(a) and (b) are a characteristic chart and diagrams showing the static characteristic for the structure shown in FIG. 1.
Figure 3B:
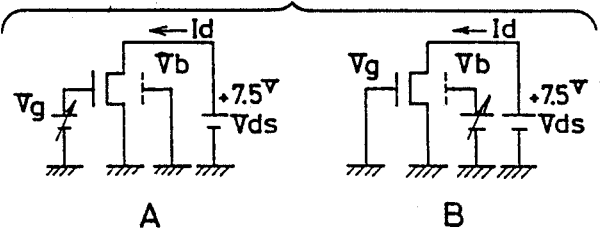

FIG. 3(a) shows the static characteristic of an a-SiTFT when the a-SiTFT is formed by the manufacturing method as described above. FIG. 3(b) shows the measuring circuit thereof. The characteristic A shown in FIG. 3(a) is measured by the measuring circuit A in FIG. 3(b). That is, it indicates the drain current Id when the gate voltage Vg is changed from −25 (volts) to 25 (volts) while setting the voltage of the light shielding layer to Vb=0 (volts). The drain current Id rises from the vicinity of 0 (volts) and the previously-observed current that rises from the vicinity of −15 (volts) is so far eliminated. The characteristic B is obtained by the measurement of the measuring circuit B in FIG. 3(b). That is, the drain current is measured when Vb is changed from −25 (volts) to 25 (volts) while setting the gate voltage to Vg=0 (volts). It can be said that this graph shows the characteristic of the current path formed along the interface between the amorphous silicon layer and the protection insulation layer. As can be seen from the Figure, the current rises from the vicinity of Vb=17 (volts).

From the foregoing description, it can be seen in an a-SiTFT formed by using the manufacturing method as described above that, since the impurity forming an acceptor is doped on the side of the amorphous silicon layer away from the gate, this side of the amorphous silicon layer is formed into a p-type and the current path formed at the interface between the amorphous silicon layer and the protection insulation layer is not formed unless a positive voltage of a certain level is applied to the light shielding layer. Accordingly, it is possible to completely eliminate the increase in the OFF current caused by the current flowing through the current path formed along the interface between the amorphous silicon layer and the protection insulation layer observed so far.

Figure 4:
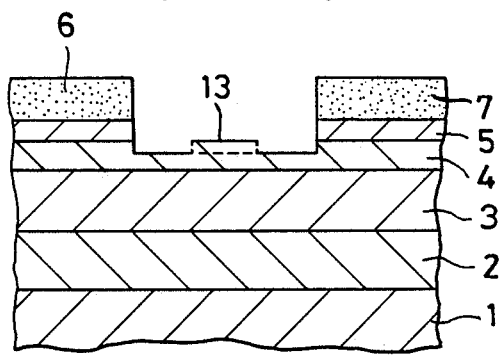
FIG. 4 is a cross sectional view illustrating an amorphous silicon thin film transistor manufactured by an alternate manufacturing method according to the present invention.
Figure 7:
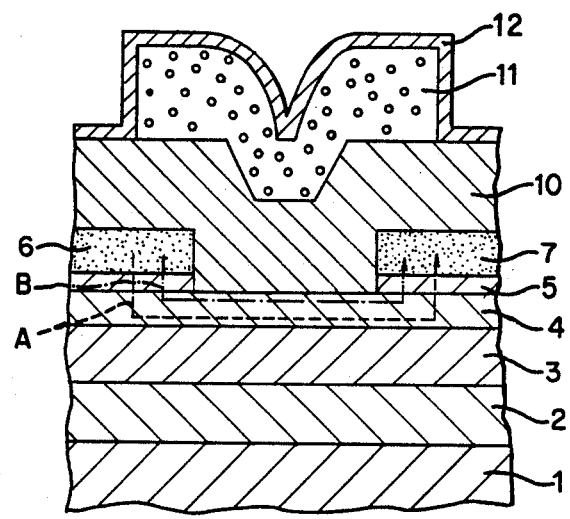
FIG. 7 is a cross sectional view showing the current path in the amorphous silicon thin film transistor shown in FIG. 5.

FIG. 4 shows another embodiment of the present invention. After forming the impurity in the same manner as in the foregoing embodiment, the impurity layer 13 is left only at the central portion of the a-SiTFT. Since the amorphous silicon layer 4 at the interface is formed into a p-type at the position where the impurity layer 13 is present, the current path is interrupted at that position, so that the same effect as that in the foregoing embodiment can be obtained.

When using the a-SiTFT as an active matrix type liquid crystal display device, an ITO layer forming a pixel electrode may sometimes be exposed to the surface upon doping the impurity. In such a case, it is preferred that the gas phase atmosphere is comprised of a gas containing the impurity forming the acceptor and an oxidizing gas, for example, $N_2O$, $CO_2$, etc. in order not to reduce the ITO layer.

According to the present invention, since the impurity forming the acceptor is activated by means of an electric field or light energy and the impurity is doped from the side of the amorphous silicon layer away from the gate, this side of the amorphous silicon layer is formed into a p-type and no electric current path is formed along the interface between the amorphous silicon layer and the protection insulation layer. Accordingly, the increase in the OFF current caused by the current path can be completely eliminated to greatly contribute to the improvement of the characteristic of the amorphous silicon thin film transistor.

We claim:

1. A method of manufacturing an amorphous silicon thin film transistor, comprising the steps of:
   exposing an amorphous silicon layer sandwiched between a gate electrode and source and drain electrodes, at a side thereof facing away from the gate electrode and which is exposed between said source electrode and said drain electrode, to a gas phase atmosphere at least having a gas containing an impurity forming an acceptor, the amorphous silicon layer being of a first conduction type and the acceptor being of a second different conduction type, and
   then activating said impurity with an electric field energy or light energy, thereby doping said activated impurity from said side of said amorphous silicon layer into said amorphous silicon layer.

2. A method for manufacturing an amorphous silicon thin film transistor as defined in claim 1, wherein said step of exposing comprises exposing said amorphous silicon layer to a gas comprising a hydrogen compound.

3. A method for manufacturing an amorphous silicon thin film transistor as defined in claim 1, wherein said step of exposing comprises exposing said amorphous silicon layer to a gas phase atmosphere comprising a gas containing an impurity forming the acceptor and an oxidizing gas.

4. A method of manufacturing an amorphous silicon thin film transistor as defined in claim 1, wherein said amorphous silicon layer is of an n-type, and said acceptor is of a p-type.

5. A method of manufacturing an amorphous silicon thin film transistor, comprising the steps of:
   forming a gate electrode on an insulating substrate,
   forming a gate insulating layer on the gate electrode,
   forming an amorphous silicon layer on said gate insulating layer,
   forming a protective silicon layer on said amorphous silicon layer such that a portion of a side of said amorphous silicon which faces away from said gate electrode is exposed,
   forming a drain electrode and a source electrode on said protective silicon layer such that said portion of the side of said amorphous silicon layer remains exposed,
   exposing the exposed portion of the side of said amorphous silicon layer to a gas phase atmosphere at least having a gas containing an impurity forming an acceptor, the amorphous silicon layer being of a first conduction type and the acceptor being of a second different conduction type, and
   activating said impurity with electric field energy or light energy to thereby dope said activated impurity from said exposed portion of the side of said amorphous silicon layer into said amorphous silicon layer.

6. A method for manufacturing an amorphous silicon thin film transistor as defined in claim 5, wherein said step of exposing includes the step of exposing said amorphous silicon layer to a gas comprising a hydrogen compound.

7. A method for manufacturing an amorphous silicon thin film transistor as defined in claim 5, wherein said step of exposing includes the step of exposing said amorphous silicon layer to a gas phase atmosphere comprising a gas containing an impurity forming the acceptor and an oxidizing gas.

8. A method for manufacturing an amorphous silicon thin film transistor as defined in claim 7, wherein said gas containing the impurity forming the acceptor is $B_2H_6$.

9. A method for manufacturing an amorphous silicon thin film transistor as defined in claim 7, wherein said oxidizing gas is $N_2O$.

10. A method for manufacturing an amorphous silicon thin film transistor as defined in claim 7, wherein said oxidizing gas is $CO_2$.

11. A method of manufacturing an amorphous silicon thin film transistor as defined in claim 5, wherein said amorphous silicon layer is of an n-type, and said acceptor is of a p-type.

* * * * *